United States Patent [19]
Roy

[11] Patent Number: 5,917,743
[45] Date of Patent: Jun. 29, 1999

[54] CONTENT-ADDRESSABLE MEMORY (CAM) FOR A FLASH MEMORY ARRAY

[75] Inventor: Anirban Roy, Fremont, Calif.

[73] Assignee: Waferscale Integration, Inc., Fremont, Calif.

[21] Appl. No.: 08/953,714

[22] Filed: Oct. 17, 1997

[51] Int. Cl.⁶ .................................................. G11C 7/00
[52] U.S. Cl. ...................................... 365/49; 365/185.16
[58] Field of Search .................... 365/49, 185.16, 365/63, 189.1, 185.33

[56] References Cited

U.S. PATENT DOCUMENTS

| | | | |
|---|---|---|---|
| 5,526,307 | 6/1996 | Yiu et al. ........................ | 365/185.16 X |
| 5,557,124 | 9/1996 | Roy et al. ............................... | 257/316 |
| 5,623,443 | 4/1997 | Kazerounian et al. ............ | 365/185.16 |

*Primary Examiner*—Do Hyun Yoo
*Attorney, Agent, or Firm*—Skjerven, Morrill, MacPherson, Franklin & Friel, LLP

[57] ABSTRACT

A content addressable memory (CAM) cell for a FLASH memory array includes four multiple-row columns of FLASH cells formed in a virtual ground architecture having a single diffusion between neighboring columns of cells. The first column has isolation elements therein and the third column has the same data value stored in each FLASH cell thereof. The CAM cell also includes elements for providing read and source voltages to the third column.

4 Claims, 2 Drawing Sheets

CONTENT-ADDRESSABLE MEMORY (CAM) FOR A FLASH MEMORY ARRAY

FIELD OF THE INVENTION

The present invention relates to content addressable memory (CAM) arrays generally and to CAM arrays in a FLASH virtual ground array architecture in particular.

BACKGROUND OF THE INVENTION

Content addressable memory (CAM) arrays are known in the art and are utilized to store the addresses of defective rows or columns of a core memory array and/or circuit operational mode control bits. Multiple addresses of the arrays are accessed at a time to retrieve a full eight bit address.

CAM arrays are often found in FLASH memory arrays. Since the size of a CAM cell is not a significant overhead issue, a read current which is higher than that needed for a FLASH memory cell is desirable. CAM cells for FLASH memories typically are created from multiple FLASH cells. In common ground array architectures, the drains of each FLASH cell are independent. Thus, each CAM cell is formed of a column of multiple FLASH cells and neighboring columns form neighboring CAM cells. Since the drains are independent, the CAM cells can be accessed simultaneously.

Virtual ground architectures do not have independent drains. Instead, neighboring columns share bit lines and the bit lines can act as either a source or drain depending on the type of voltage provided to it. As a result, a CAM array cannot be easily produced with the virtual ground architecture although a CAM array can be produced for a virtual ground core memory array using a different cell design.

One example of a virtual ground architecture is the alternate metal, virtual ground architecture in which there are two bit lines for every metal line. To achieve this, there are some bit lines which are not metal clad and there are select transistors connecting the metal lines to these non-metal bit lines.

SUMMARY OF THE INVENTION

An object of the present invention is to provide a content addressable memory (CAM) array for virtual ground FLASH memory arrays using the virtual ground FLASH architecture.

There is therefore provided, in accordance with a preferred embodiment of the present invention, a content addressable memory (CAM) cell for a FLASH memory array which includes four multiple-row columns of FLASH cells formed in a virtual ground architecture having a single diffusion between neighboring columns of cells. The first column has isolation elements therein and the third column has the same data value stored in each FLASH cell thereof. The CAM cell also includes elements for providing read and source voltages to diffusions on both sides of the third column.

Additionally, in accordance with a preferred embodiment of the present invention, the virtual ground architecture is an alternate metal virtual ground architecture.

Moreover, in accordance with a preferred embodiment of the present invention, elements for providing include one dedicated, metal bit line located between the first and second columns, one dedicated, metal read line located between the third and fourth columns and connected to the diffusion between the third and fourth columns and two select transistors each connecting the metal bit line to the diffusion between the second and third columns.

Further, in accordance with an alternative preferred embodiment of the present invention, the elements for providing include one dedicated, metal bit line clad to the diffusion located between the second and third columns and one dedicated, metal read line clad to the diffusion located between the third and fourth columns.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
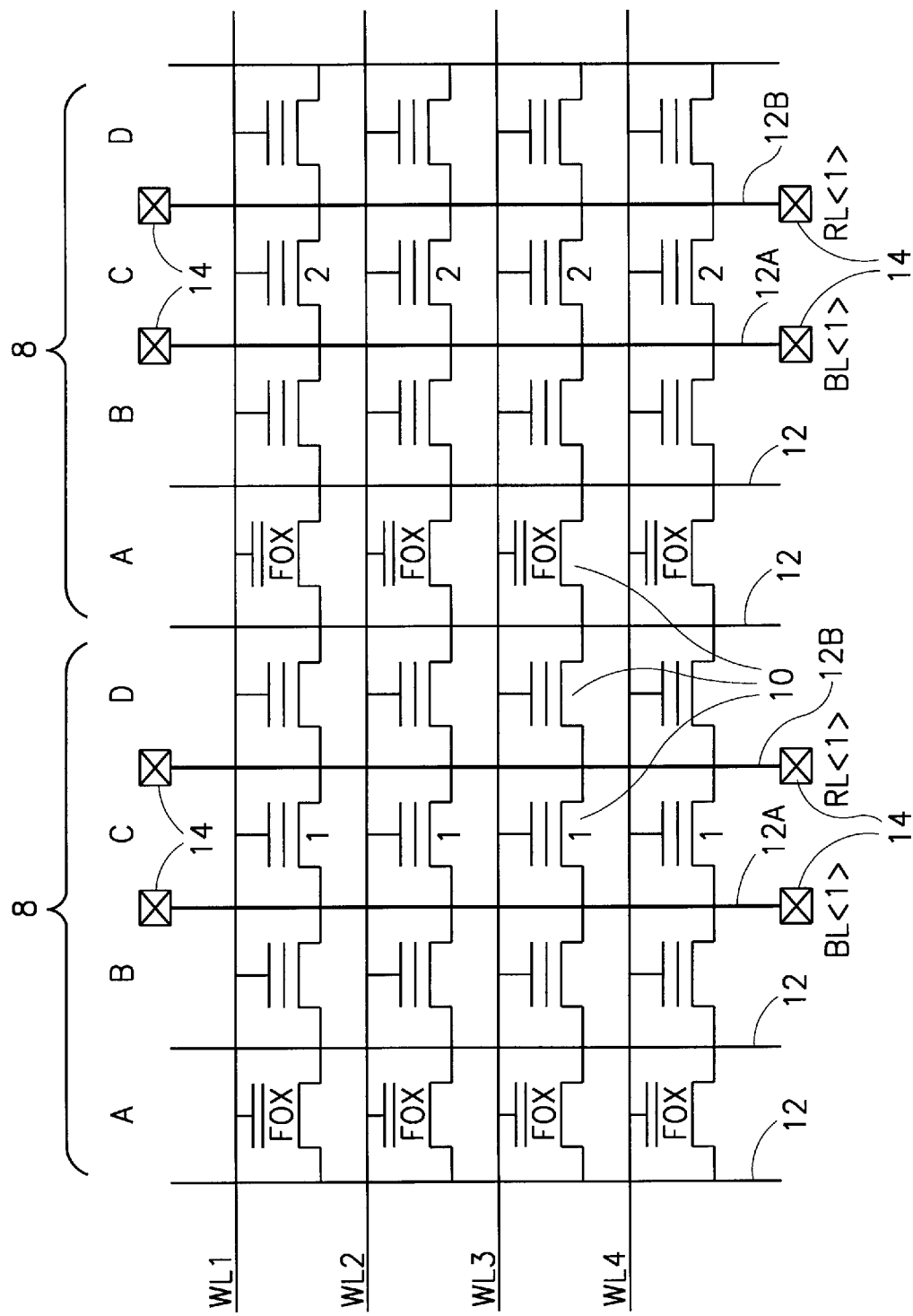
FIG. 1 is a circuit diagram illustration of a CAM cell using a virtual ground FLASH architecture, constructed and operative in accordance with a first preferred embodiment of the present invention.

Reference is now made to FIG. 1, which is a circuit diagram illustration of a virtual ground FLASH CAM cell, constructed and operative in accordance with a first preferred embodiment of the present invention.

Each CAM cell 8 comprises four, multiple-row columns of virtual ground FLASH cells 10 with diffusion lines 12 between cells of neighboring columns. In addition, each CAM cell 8 has two diffusion lines 12A and 12B which are clad with metal (shown with thick lines) and have contacts 14 connected thereto. The resultant, metal clad bit lines 12A and 12B are dedicated as a bit line BL<j> and a read line RL<j> for the jth CAM cell, where j indicates the index of the CAM cell and two CAM cells 1 and 2 are shown.

The four columns are labeled A, B, C and D where the bit line BL runs between columns B and C and read line RL runs between columns C and D. Only column C is utilized to store the bit of interest. Columns B and D are not programmed and column A has field or thick oxides in the cells. Thick oxides are described in U.S. Pat. No. 5,623,443 granted to the common assignees of the present invention. U.S. Pat. No. 5,623,443 is incorporated herein by reference. Column A thus isolates each CAM cell from its neighbor.

Word lines WLi access the gates of a row of FLASH cells 10. Typically, there are four word lines WLi in a CAM cell, thereby providing 16 FLASH cells 10; however, other amounts of word lines are possible and are incorporated in the present invention.

In the core memory array, every diffusion line is capable of receiving source and drain voltages. However, for the CAM cell of FIG. 1, where only column C is accessed, only the diffusion lines 12A and 12B, which neighbor column C, must receive voltage.

Each column C holds the data of one CAM cell. The multiple FLASH cells 10 of the column provide the desired read current of 100 $\mu$A–200 $\mu$A. Furthermore, since each column C is accessed by its own bit line BL and read line RL, the CAM cells are independently accessed and thus, can be accessed simultaneously. Finally, since the CAM cells are isolated from each other via columns A, which have field or thick oxides in the cells, neighboring CAM cells can be read simultaneously.

It will be appreciated that the CAM cells of the present invention have the same architecture of virtual ground FLASH cells and therefore, accommodate to the same manufacturing process as the core memory of virtual ground FLASH cells.

Like all FLASH cells, the CAM cells can be read, programmed and erased. The following truth table provides the voltage values for the word lines WL, the bit lines BL and the read lines RL for the read, programming and erasure operations. It is noted that all of the word lines of a CAM cell receive the same voltage and that the bit lines BL and read lines RL for all of the CAM cells of interest receive the same voltages, thereby to simultaneously access all of the CAM cells.

| Mode | Wli | BL<j> | RL<j> |
|---|---|---|---|
| Read | Vccr | 0V | Vread |
| Programming | VcVp | Vpd, if the cell is to be programmed 0V, if not | 0V |
| Erasure | Vneg | floating | Vpd |

It is further noted that Vccr is a regulated standard input voltage and is typically 5V, VcVp is a programming voltage, typically of 10V, Vpd is 6V, Vread is the reading voltage of 1.3 V and Vneg is a negative voltage used to induce erasure and is typically of −8V. It is finally noted that, as indicated by the truth table hereinabove, the CAM cell of the present invention is read, programmed and erased in a manner similar to that of a standard virtual ground FLASH cell.

Figure 2:
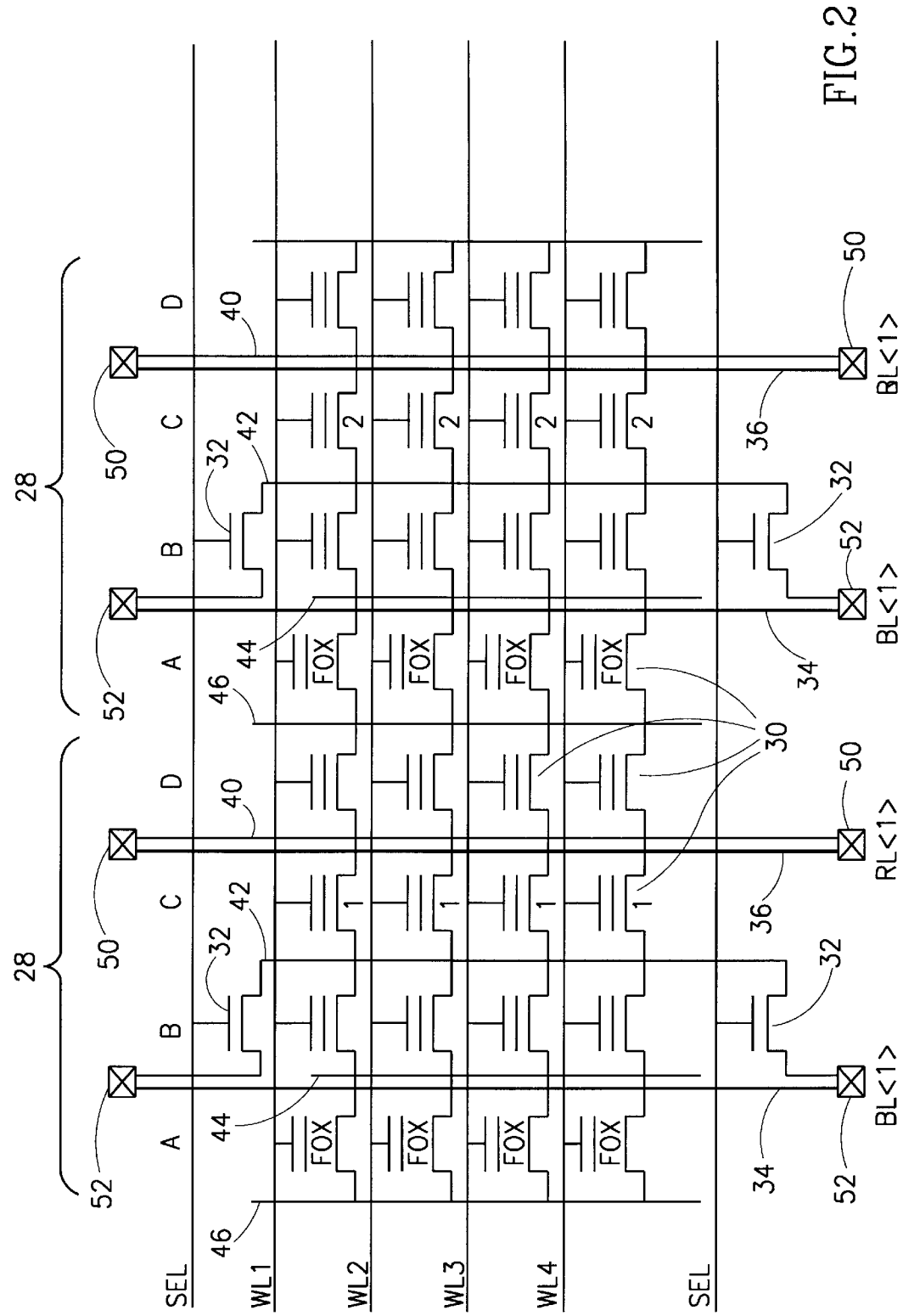
FIG. 2 is a circuit diagram illustration of a CAM cell using a alternate metal, virtual ground (AMG) FLASH architecture, constructed and operative in accordance with a second preferred embodiment of the present invention.

Reference is now made to FIG. 2, which is a circuit diagram illustration of an alternate metal, virtual ground (AMG) FLASH CAM cell, constructed and operative in accordance with a second preferred embodiment of the present invention. The present invention utilizes the AMG FLASH architecture described in U.S. Pat. No. 5,557,124, granted to the common assignees of the present invention and incorporated herein by reference.

As in the standard virtual ground embodiment, each CAM cell 28 of FIG. 2 comprises two select transistors 32 and four, multiple-row columns of cells 30 where, in this embodiment, the cells are AMG FLASH cells. Furthermore, in this embodiment, none of the diffusions, labeled 40, 42, 44 and 46, are metal clad. Instead, this embodiment includes two metal lines 34 and 36, where metal line 34 is dedicated to be bit line BL<j> and metal line 36 is dedicated to be read line RL<j>.

As discussed in U.S. Pat. No. 5,557,124, the diffusions 40, 42, 44 and 46, which connect the sources or drains of a column of cells, are segmented. Metal lines 34 and 36 are present near alternate diffusions. Diffusion 40 receives the source voltage via contacts 50 which directly connect it to the metal line 36. Diffusion 42 receives the drain voltage from metal line 34 via select transistors 32.

Only column C, whose source 40 is connected to the read line RL, is utilized to store the bit of interest. As in the previous embodiment, columns B and D are not programmed and column A has field or thick oxides in the cells. Word lines WLi access the gates of the rows of FLASH cells 30 and select lines SEL access the gates of the select transistors 32.

The following truth table provides the voltage values for the word lines WL, the select lines SEL, the bit lines BL and the read lines RL for the read, programming and erasure operations of the AMG CAM cell and is similar to the previous truth table.

| Mode | Wli | BL<j> | RL<j> | SEL |
|---|---|---|---|---|
| Read | Vccr | 0V | Vread | Vsel if the cell is to be read or 0V if not |
| Programming | VcVp | Vpd if the cell is to be programmed or 0V if not | 0V | Vsel |
| Erasure | Vneg | floating | Vpd | 0V |

It is noted that Vsel is typically equal to a standard voltage Vcc during reading and is about 11V during programming.

It will be appreciated by persons skilled in the art that the present invention is not limited by what has been particularly shown and described herein above. Rather the scope of the invention is defined by the claims that follow:

I claim:

1. A content addressable memory (CAM) cell for a FLASH memory array, the CAM cell comprising:

first, second, third and fourth multiple-row columns of FLASH cells formed in a virtual ground architecture having a single diffusion between neighboring columns of cells, wherein said first column has isolation elements therein and said third column has the same data value stored in each FLASH cell thereof; and means for providing read and bit line voltages to said third column.

2. A CAM cell according to claim 1 and wherein said virtual ground architecture is an alternate metal virtual ground architecture.

3. A CAM cell according to claim 2 and wherein said means for providing includes:

one dedicated, metal bit line located between said first and second columns;

one dedicated, metal read line located between said third and fourth columns and connected to the diffusion between said third and fourth columns; and two select transistors each connecting said metal bit line to the diffusion between said second and third columns.

4. A CAM cell according to claim 1 and wherein said means for providing includes:

one dedicated, metal bit line clad to the diffusion located between said second and third columns; and one dedicated, metal read line clad to the diffusion located between said third and fourth columns.

* * * * *